(12) United States Patent
Makino et al.

(10) Patent No.: US 6,826,503 B2
(45) Date of Patent: Nov. 30, 2004

(54) PHYSICAL QUANTITY DETECTION EQUIPMENT

(75) Inventors: Yasuaki Makino, Okazaki (JP); Toshio Ikuta, Handa (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/602,816

(22) Filed: Jun. 25, 2003

(65) Prior Publication Data

US 2004/0010389 A1 Jan. 15, 2004

(30) Foreign Application Priority Data

Jul. 11, 2002 (JP) .................................. 2002-202902

(51) Int. Cl.⁷ .......................... G01C 19/00; G01C 25/00
(52) U.S. Cl. .................................................... 702/104
(58) Field of Search .......................... 702/104, 94, 96, 702/99, 98, 85, 105; 73/1.01, 1.37

(56) References Cited

U.S. PATENT DOCUMENTS

| | | | |
|---|---|---|---|
| 4,263,803 A | * | 4/1981 | Burkhardt .................... 73/1.81 |
| 4,488,439 A | * | 12/1984 | Gast et al. ................. 73/861.18 |
| 4,763,973 A | * | 8/1988 | Inoue et al. .................... 385/12 |
| 5,103,171 A | * | 4/1992 | Petersen .................. 324/207.23 |
| 5,422,478 A | * | 6/1995 | Wlodarczyk et al. .. 250/227.21 |
| 5,770,883 A | * | 6/1998 | Mizuno et al. .............. 257/417 |
| 6,188,340 B1 | * | 2/2001 | Matsumoto et al. ........ 341/110 |
| 6,377,110 B1 | * | 4/2002 | Cooper ........................ 327/513 |
| 6,477,903 B2 | * | 11/2002 | Okada .................... 73/862.043 |
| 2002/0117009 A1 | * | 8/2002 | Keech ...................... 73/861.17 |

FOREIGN PATENT DOCUMENTS

JP   A-11-241858   9/1999

* cited by examiner

Primary Examiner—John Barlow
Assistant Examiner—Demetrius Pretlow
(74) Attorney, Agent, or Firm—Posz & Bethards, PLC

(57) ABSTRACT

Physical quantity detection equipment includes a detector, an amplifier, an offset adjustment device, an addition device, and an output device. The detector outputs the first voltage corresponding to the detected physical quantity. The amplifier amplifies the first voltage. The offset adjustment device determines a measurement range of the amplified first voltage and outputs a second voltage corresponding to the determined measurement range. The addition device subtracts the second voltage from the amplified first voltage. The output device outputs the subtracted amplified first voltage and informs the determined measurement range. The equipment has only one sensing unit for detecting both a large and a fine change in physical quantity.

12 Claims, 8 Drawing Sheets

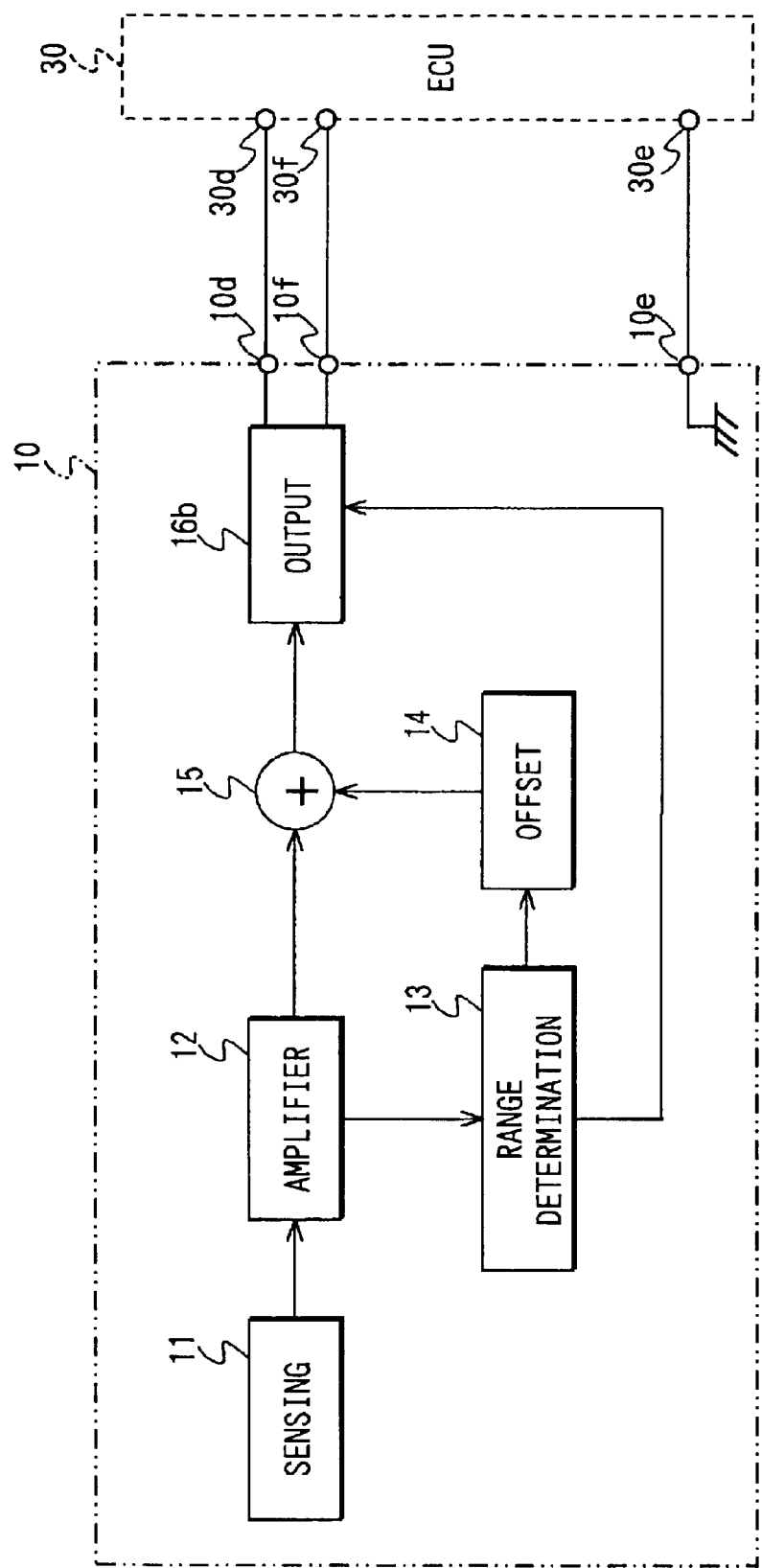

PHYSICAL QUANTITY DETECTION EQUIPMENT

CROSS REFERENCE TO RELATED APPLICATION

This application is based on Japanese Patent Application No. 2002-202902 filed on Jul. 11, 2002, the disclosure of which is incorporated herein by reference.

FIELD OF THE INVENTION

The present invention relates to physical quantity detection equipment for detecting physical quantity.

BACKGROUND OF THE INVENTION

Recently, a physical quantity sensor for detecting a physical quantity such as pressure, temperature, and acceleration, is much required in accordance with the home automation and the car automation. When a physical quantity sensor having a single measurement range is set to detect a large change in physical quantity, the sensor cannot detect a fine change in the physical quantity. In this case, detection resolution of the sensor, i.e., detection accuracy, is comparatively low. Conversely, when the sensor is set to have high detection accuracy, the sensor cannot detect a large change in the physical quantity.

To detect both a large and fine change in physical quantity, a physical quantity sensor having a plurality of measurement ranges is proposed. As shown in FIG. 8, a physical quantity sensor 50 includes three sensing units 50a–50c. Each sensing unit 50a–50c has a sensing device 51a–51c, an amplifier 52a–52c, and an output circuit 55a–55c. Each output circuit 55a–55c connects to an electronic control unit (i.e., ECU) 30 through a wire harness, respectively.

Here, by providing each amplifier 52a–52c a different offset, for example, the amplifier 52a in the sensing unit 51a operates as a linear amplifier in the first measurement range between P0 and P1, as shown in FIG. 9. Similarly, the amplifier 52b operates in the second measurement range between P1 and P2, and the amplifier 52c operates in the third measurement range between P2 and P3. Accordingly, the sensor 50 can detect a pressure change in a wide pressure range by switching a plurality of sensing units 50a–50c having a different offset.

However, the sensor 50 according to a related art necessitates a plurality of sensing units 50a–50c, so that both cost and size of the sensor 50 increase.

SUMMARY OF THE INVENTION

In view of the above problems, it is an object of the present invention to provide physical quantity detection equipment having only one sensing unit for detecting both a large and a fine change in physical quantity. It is another object of the present invention to provide a detecting method for detecting both a large and a fine change in physical quantity Physical quantity detection equipment includes a detector, an amplifier, an offset adjustment device, an addition device, and an output device. The detector detects physical quantity and outputs a first voltage corresponding to the detected physical quantity. The amplifier amplifies the first voltage. The offset adjustment device determines a measurement range of the amplified first voltage among a plurality of predetermined measurement ranges, and outputs a second voltage corresponding to the determined measurement range. The addition device subtracts the second voltage from the amplified first voltage, and outputs the subtracted amplified first voltage, which is in the determined voltage range. The output device outputs the subtracted amplified first voltage to an outside circuit, and informs the determined measurement range to the outside circuit. The outside circuit calculates the physical quantity based on the subtracted amplified first voltage and the determined measurement range.

A variable range of the subtracted amplified first voltage can be set comparatively large, so that the outside circuit detects the subtracted amplified first voltage accurately. Therefore, the equipment can detect the physical quantity in a wide range without decreasing the detection accuracy substantially. Thus, the equipment detects both a large and a fine change in the physical quantity.

Preferably, the output device controls consumption current, which is current consumed in the output device and is supplied to the output device from the outside circuit. The controlled consumption current corresponds to the determined measurement range so that the output device informs the determined measurement range to the outside circuit.

Preferably, the output device supplies current to the outside circuit. Here, the supplied current corresponds to the determined measurement range so that the output means informs the determined measurement range to the outside circuit.

Preferably, the output device modulates the subtracted amplified first voltage with a predetermined frequency corresponding to the determined measurement range, and outputs the modulated subtracted amplified first voltage to the outside circuit so that the output device informs both the subtracted amplified first voltage and the determined measurement range to the outside circuit.

Preferably, the output device includes a first circuit for outputting the subtracted amplified output voltage to the outside circuit and a second circuit for outputting a range signal corresponding to the determined measurement range to the outside circuit.

Next, a method for detecting physical quantity includes the steps of detecting physical quantity, so that a first voltage corresponding to the detected physical quantity is outputted, determining a measurement range of the first voltage among a plurality of predetermined measurement ranges, so that a second voltage corresponding to the determined measurement range is outputted, subtracting the second voltage from the first voltage, and outputting the subtracted first voltage and an information about the determined measurement range.

A variable range of the subtracted first voltage can be set comparatively large, so that the subtracted first voltage is detected accurately. Therefore, the physical quantity can be detected in a wide range without decreasing the detection accuracy substantially. Thus, both a large and a fine change in the physical quantity can be detected.

Preferably, the subtracted first voltage and the information about the determined measurement range are detected by an outside circuit so that the outside circuit calculates the physical quantity based on the subtracted first voltage and the information about the determined measurement range.

Preferably, the outputting step further includes the step of controlling consumption current, which is consumed in a circuit that provides the outputting step and is supplied from an outside circuit. Here the consumption current corresponds to the determined measurement range so that the outside circuit calculates the physical quantity based on the subtracted first voltage and the determined measurement range.

Preferably, the outputting step further includes the step of supplying current to an outside circuit. Here the current corresponds to the determined measurement range so that the outside circuit calculates the physical quantity based on the subtracted first voltage and the determined measurement range.

Preferably, the outputting step further includes the steps of modulating the subtracted first voltage with a predetermined frequency corresponding to the determined measurement range, and outputting the modulated subtracted first voltage to an outside circuit so that the outside circuit calculates the physical quantity based on the modulated subtracted first voltage.

BRIEF DESCRIPTION OF THE DRAWINGS

The above and other objects, features and advantages of the present invention will become more apparent from the following detailed description made with reference to the accompanying drawings. In the drawings:

FIG. 4 is a schematic diagram showing pressure detection equipment according to the second embodiment of the present invention;

DETAILED DESCRIPTION OF THE PREFERRED EMBODIMENTS (First Embodiment)

Figure 1:
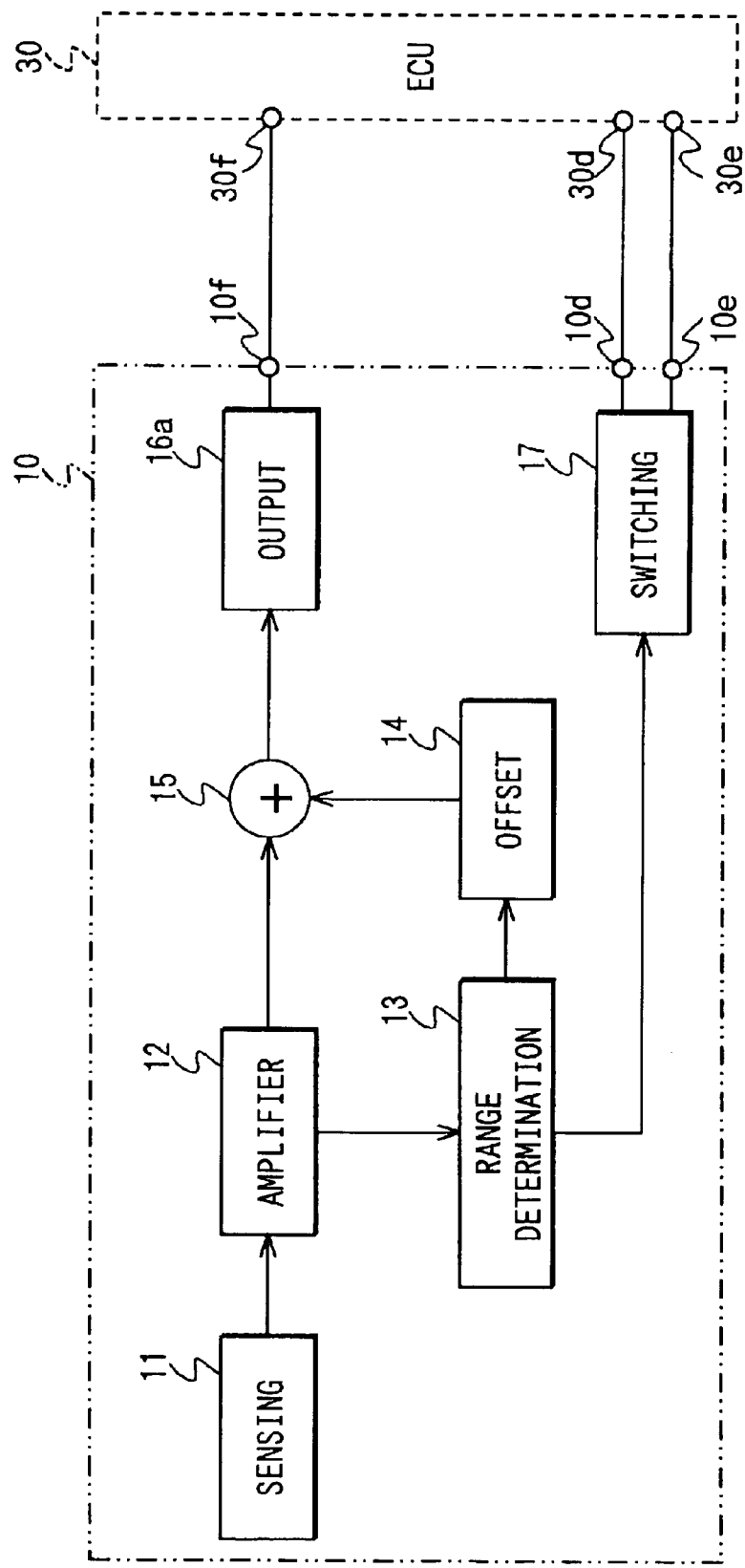
FIG. 1 is a schematic diagram showing pressure detection equipment according to the first embodiment of the present invention.

As shown in FIG. 1, pressure detection equipment 10 according to the first embodiment includes a sensing device 11, an amplifier 12, a range-determination circuit 13, an offset circuit 14, an adder 15, an output circuit 16a, and a switching circuit 17. The equipment 10 connects to an electronic control unit (i.e., ECU) 30 through a wire harness. The power source terminal 10d, the ground terminal 10e, and the signal terminal 10f of the equipment 10 connect to the power source terminal 30d, the ground terminal 30e, and the signal terminal 30f of the ECU 30, respectively.

The sensing device 11 detects pressure by using a thin diaphragm (not shown), and outputs an initial output voltage in accordance with the detected pressure. The amplifier 12 amplifies the initial output voltage inputted from the sensing device 11. The range-determination circuit 13 has a plurality of window comparators (not shown) for determining a measurement range of the amplified initial output voltage among a plurality of predetermined measurement ranges. When pressure is applied to the sensing device 11, the range-determination circuit 13 determines the measurement range where the amplified initial output voltage belongs. Then, the range-determination circuit 13 outputs a range-determination signal in accordance with the determined measurement range.

Each window comparator has a threshold for defining each measurement range. For example, the first window comparator has the first threshold that provides the first measurement range between P0 and P1, the second threshold for the second measurement range between P1 and P2, and so on. For example, when the amplified initial output voltage is below the first threshold, the amplified initial output voltage belongs to the first measurement range. After determining the measurement range, the range-determination circuit 13 outputs the range-determination signal, which provides information about the determined measurement range. Here, four measurement ranges P0–P1, P1–P2, P2–P3, P3–P4 are provided, and a 3-bit signal is used as the range-determination signal.

The offset circuit 14 outputs an offset adjustment voltage in accordance with the range-determination signal inputted from the range-determination circuit 13. When the range-determination signal corresponds to the first measurement range between P0 and P1, the offset adjustment voltage is zero. When the range-determination signal corresponds to the second measurement range between P1 and P2, the offset adjustment voltage is V1. When the range-determination signal corresponds to the third measurement range between P2 and P3, the offset adjustment voltage is 2×V1, and so on. Thus, the offset circuit 14 outputs N times V1 voltage, i.e., N×V1 (N=0, 1, 2, . . . ) as the offset adjustment voltage.

Figure 3A:
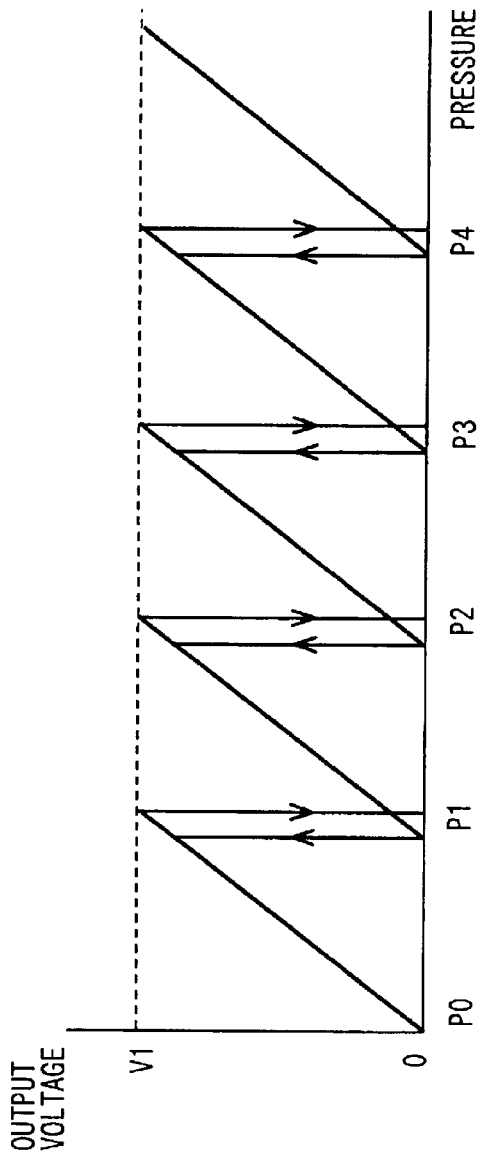
FIG. 3A is a graph showing a relationship between a final output voltage of an output circuit and detected pressure according to the first embodiment.

The adder 15 subtracts the offset adjustment voltage from the amplified initial output voltage inputted from the amplifier 12. Then, the output circuit 16a receives a subtracted output voltage inputted from the adder 15, and outputs the subtracted output voltage as a final output voltage to the ECU 30. Accordingly, the final output voltage outputted from the output circuit 16a changes between zero volt and V1 volt in each measurement range P0–P1, P1–P2, P2–P3, P3–P4, as shown in FIG. 3A. Here, the range determination circuit 13 has a hysteresis characteristic of the range-determination signal This hysteresis characteristic prevents the final output voltage from fluctuating. Moreover, the hysteresis characteristic prevents consumption current consumed in the switching circuit from fluctuating. Thus, a pressure-output voltage curve has a hysteresis characteristic, as shown in FIG. 3A.

The final output voltage from the output circuit 16a is inputted to the ECU 30 through the wire harness. Since the final output voltage changes between zero volt and V1 volt in each measurement range, P0–P1, P1–P2, P2–P3, P3–P4, the ECU 30 is required to recognize the measurement range where the output voltage belongs so as to calculate the amplified initial output voltage of the amplifier 12. In this case, if the range-determination signal from the range-determination circuit 13 is simply inputted to the ECU 30, many wire harness between the pressure detection equipment 10 and the ECU 30 is necessitated. Therefore, in the first embodiment, the switching circuit 17 for switching the consumption current enables the ECU 30 to detect the determined measurement range of the final output voltage without increasing the wire harness. Here, the consumption current is current consumed in the switching circuit 17, and corresponds to the determined measurement range. The switching circuit 17 controls the consumption current so as to correspond to the determined measurement range.

Figure 2:
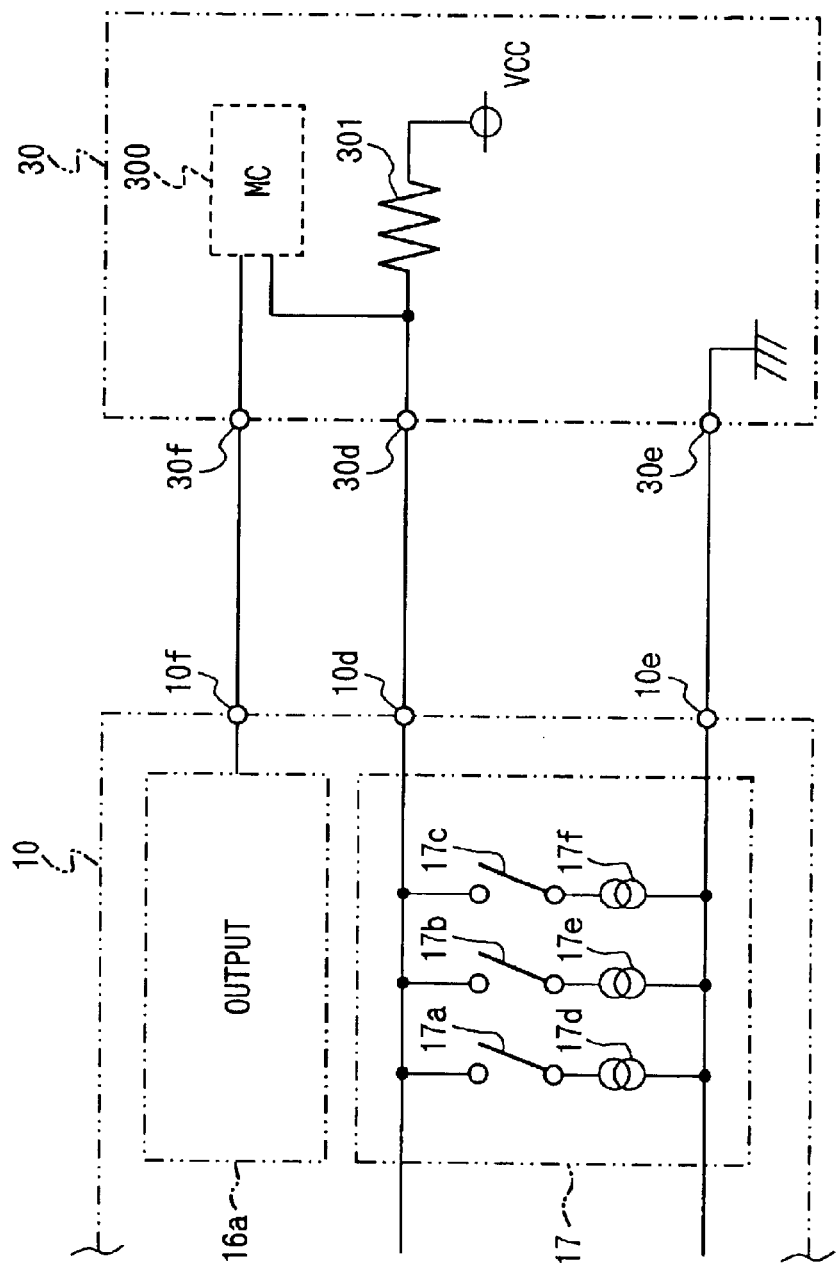
FIG. 2 is a partial diagram showing a switching circuit and an ECU according to the first embodiment.
Figure 3B:
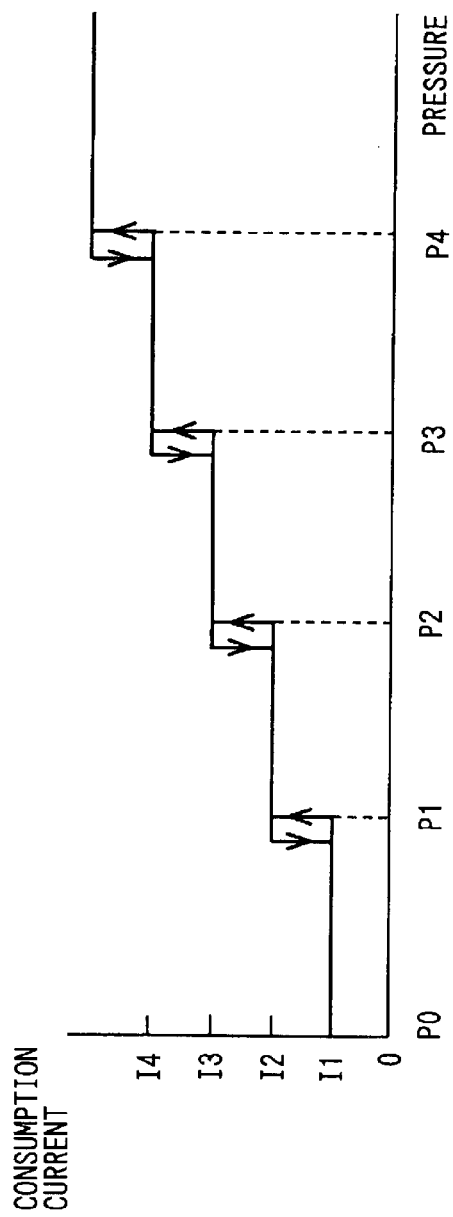
FIG. 3B is a graph showing a relationship between the consumption current of a switching circuit and detected pressure according to the first embodiment.

As shown in FIG. 2, the switching circuit 17 includes three switches 17a–17c, and three constant current circuits 17d–17f. Each switch 17a–17c switches on and off according to the 3-bit signal as the range-determination signal inputted from the range-determination circuit 13. A different constant current flows in each constant current circuit 17d–17f, so that the consumption current consumed in the switching circuit 17 can be switched eight ways by a combination of on/off switching of the switches 17a–17c. Thus, as shown in FIG. 3B, the consumption current changes from I1 to I4 in accordance with the measurement range P0–P1, P1–P2, P2–P3, P3–P4.

The ECU 30 supplies the consumption current to the switching circuit 17 through a resistor 301, as shown in FIG. 2. When the consumption current of the equipment 10 changes eight ways, a terminal voltage between two ends of the resistor 301 also changes in accordance with the consumption current. Therefore, the measurement range of the final output voltage corresponding to the consumption current can be detected by measuring the terminal voltage between two ends of the resistor 301.

The ECU 30 has a microcomputer 300 (i.e., MC). The microcomputer 300 detects the final output voltage outputted from the output circuit 16a and the terminal voltage of the resistor 301 through a built-in type or exterior type A/D converter (not shown). Thus, the microcomputer 300 recognizes the determined measurement range of the final output voltage by detecting the terminal voltage so that the microcomputer 300 calculates the detected pressure based on the final output voltage and the determined measurement range. In other words, the detected pressure is calculated by adding the offset adjustment voltage corresponding to the measurement range, i.e., N×V1 (N=0, 1, 2, . . . ), to the final output voltage.

In the first embodiment, a variable range of the final output voltage in each measurement range is between zero and V1, so that the variable range of the final output voltage can be set comparatively large. Therefore, the ECU 30 can detect the final output voltage accurately, so that the pressure is detected accurately. Moreover, the equipment 10 can detect pressure in such a wide range between P0 and P4 without decreasing the detection accuracy substantially and without adding a new sensing device. Thus, the equipment 10 having only one sensing unit detects both a large and a fine change in pressure. Further, since the consumption current of the pressure detection equipment 10 expresses the range-determination signal, the ECU 30 can detect the range-determination signal without adding a new signal wire, i.e., the new wire harness, between the pressure detection equipment 10 and the ECU 30.

(Second Embodiment)

The pressure detection equipment 10 according to the second embodiment includes the sensing device 11, the amplifier 12, the range-determination circuit 13, the offset circuit 14, the adder 15, and an output circuit 16b, as shown in FIG. 4.

Figure 5:
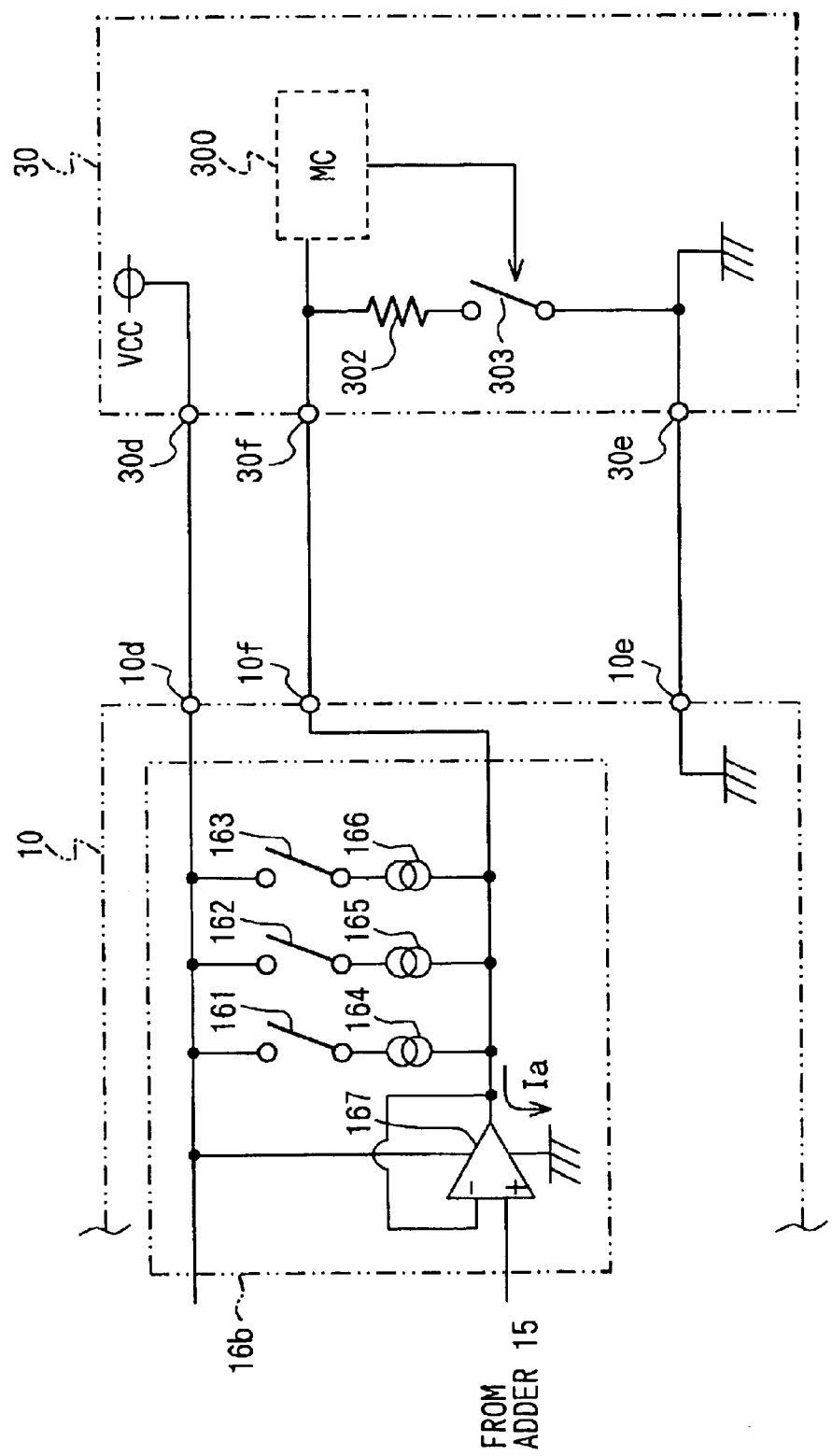
FIG. 5 is a partial diagram showing an output circuit and an ECU according to the second embodiment.

The subtracted output voltage from the adder 15, i.e., the offset adjusted output voltage, and the range-determination signal from the range-determination circuit 13 are inputted to the output circuit 16b. The output circuit 16b outputs the final output voltage to the ECU 30, and controls a current supply capability in accordance with the range-determination signal. As shown in FIG. 5, the output circuit 16b includes an operational amplifier 167, three switches 161–163, and three constant current circuits 164–166.

The input terminal of the operational amplifier 167 connects to the adder 15, and the output terminal of the operational amplifier 167 connects to the constant current circuits 164–166 and the signal terminal 10f. The operational amplifier 167 outputs the final output voltage in accordance with the subtracted output voltage to the ECU 30 through the signal terminal 10f, 30f. Each switch 161–163 is controlled by a 3-bit signal of the range-determination signal, so that current flowing through each constant current circuit 164–166 is controlled. Here, each current flowing through the constant current circuit 164–166 is different from each other. Therefore, the total current as the constant current flowing through the output circuit 16b changes eight ways by a combination of on/off switching of three switches 161–163, so that the output circuit 16b outputs the constant current in eight ways. Here, the constant current expresses the current supply capability, i.e., the range-determination signal.

On the other hand, the ECU 30 has the microcomputer 300, a resistor 302, and a switch 303. The resistance of the resistor 302 is sufficiently smaller than the output impedance of the operational amplifier 167. The microcomputer 300 detects both the final output voltage and the range-determination signal as follows.

It is assumed that only the switch 161 in the output circuit 16b switches on, and residual two switches 162, 163 switch off, according to the range-determination signal. At first, the switch 303 in the ECU 30 switches off. The current flowing through the constant current circuit 164 is absorbed into the operational amplifier 167 through a channel Ia, because the output terminal of the operational amplifier 167 has low impedance, so that the current is absorbed as an excess current. At this time, the microcomputer 300 detects the final output voltage outputted from the output circuit 16b corresponding to the subtracted output voltage.

Next, when the microcomputer 300 controls the switch 303 to switch on, the current flowing through the constant current circuit 164 flows into the resistor 302 through the signal terminals 10f, 30f because the resistance of the resistor 302 is sufficiently smaller than the output impedance of the operational amplifier 167. Then, the final output voltage inputted into the microcomputer 300 changes. This changed output voltage provides the product of the current flowing through the constant current circuit 164 and the resistance of the resistor 302. Therefore, the current can be calculated from the changed output voltage. Here, the current expresses the current supply capability, i.e., the range-determination signal.

The ECU 30 controls the switch 303 to switch on/off temporally, so that the ECU 30 detects the final output voltage and the range-determination signal. Thus, the ECU 30 calculates the pressure based on the final output voltage and the range-determination signal.

In the second embodiment, the variable range of the output circuit 16b can be set comparatively large. Therefore, the ECU 30 can detect the output voltage from the output circuit 16b accurately so that the pressure is detected accurately. Moreover, the equipment 10 can detect pressure in such a wide range between P0 and P4 without decreasing the detection accuracy substantially and without adding a new sensing device. Thus, the equipment 10 having only one sensing unit detects both a large and a fine change in pressure. Further, the ECU can detect the range-determination signal without adding a new signal wire between the pressure detection equipment 10 and the ECU 30.

(Third Embodiment)

Figure 6:
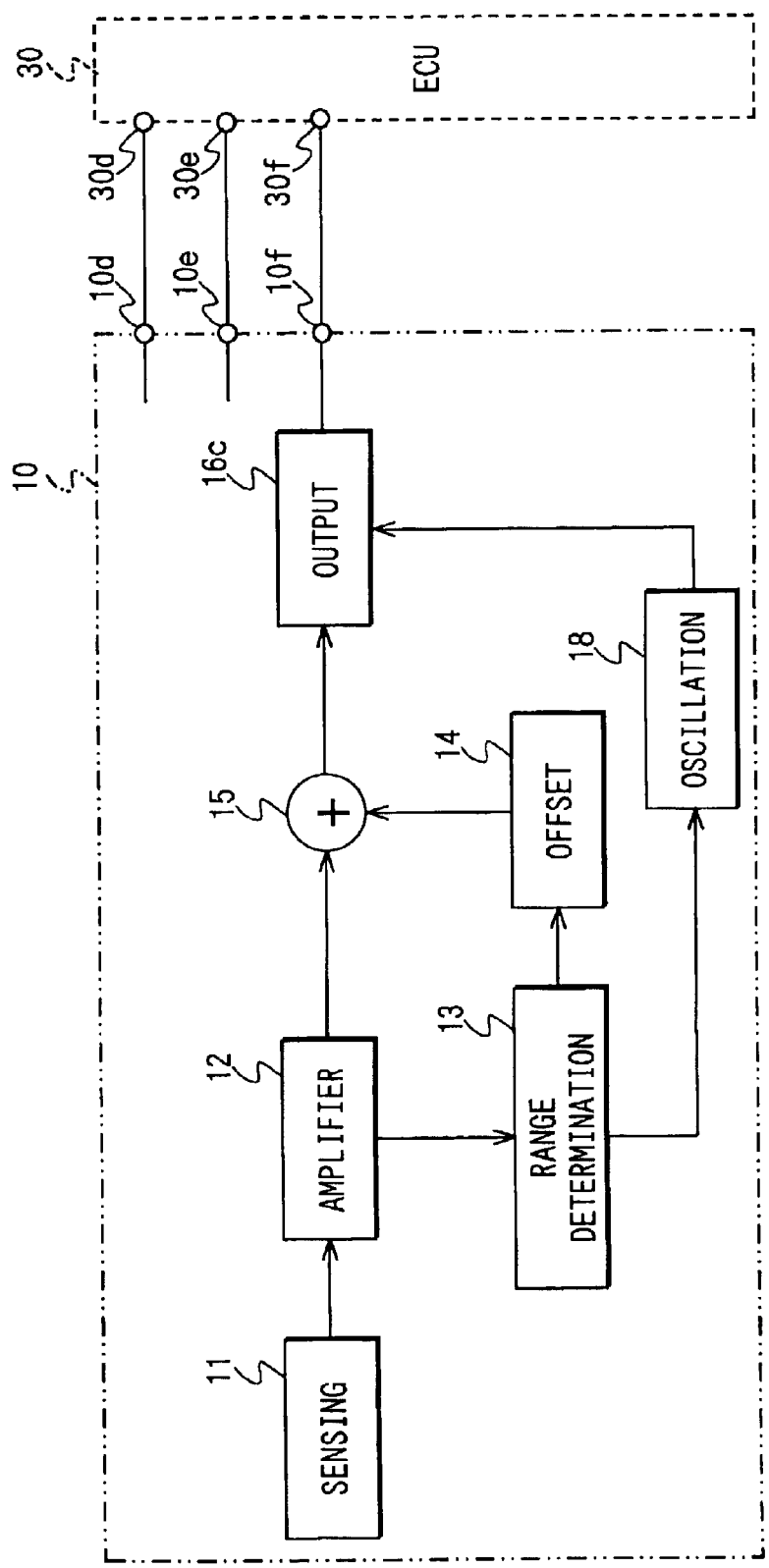
FIG. 6 is a schematic diagram showing pressure detection equipment according to the third embodiment of the present invention.

The pressure detection equipment 10 according to the third embodiment includes the sensing device 11, the amplifier 12, the range-determination circuit 13, the offset circuit 14, the adder 15, an output circuit 16c, and an oscillation circuit 18, as shown in FIG. 6.

The oscillation circuit 18 outputs a sine wave having a predetermined frequency in accordance with the range-determination signal from the range-determination circuit 13. The output circuit 16c modulates the subtracted output voltage, i.e., the final output voltage, by using the sine wave, so that the output circuit 16c outputs the modulated sine wave. Therefore, the predetermined frequency in accordance with the range-determination signal is superimposed on the final output voltage.

The ECU 30 includes a frequency counter (not shown) and a filter (not shown). The frequency counter detects the superimposed frequency, i.e., the predetermined frequency. The predetermined frequency expresses the range-determination signal. Then, the superimposed frequency is eliminated by the filter, so that the ECU 30 can detect an analogue signal corresponding to the final output voltage. Therefore, the ECU 30 calculates the pressure based on the final output voltage and the range-determination signal.

In the third embodiment, the variable range of the output circuit 16c can be set large, so that the ECU 30 can detect the output voltage from the output circuit 16c accurately. Further, the equipment 10 detects both a large and a fine change in pressure. Moreover, the range-determination signal corresponds to the superimposed frequency, which is superimposed on the final output voltage. Therefore, the ECU 30 can detect the range-determination signal without adding a new signal wire between the pressure detection equipment 10 and the ECU 30.

(Fourth Embodiment)

Figure 7:
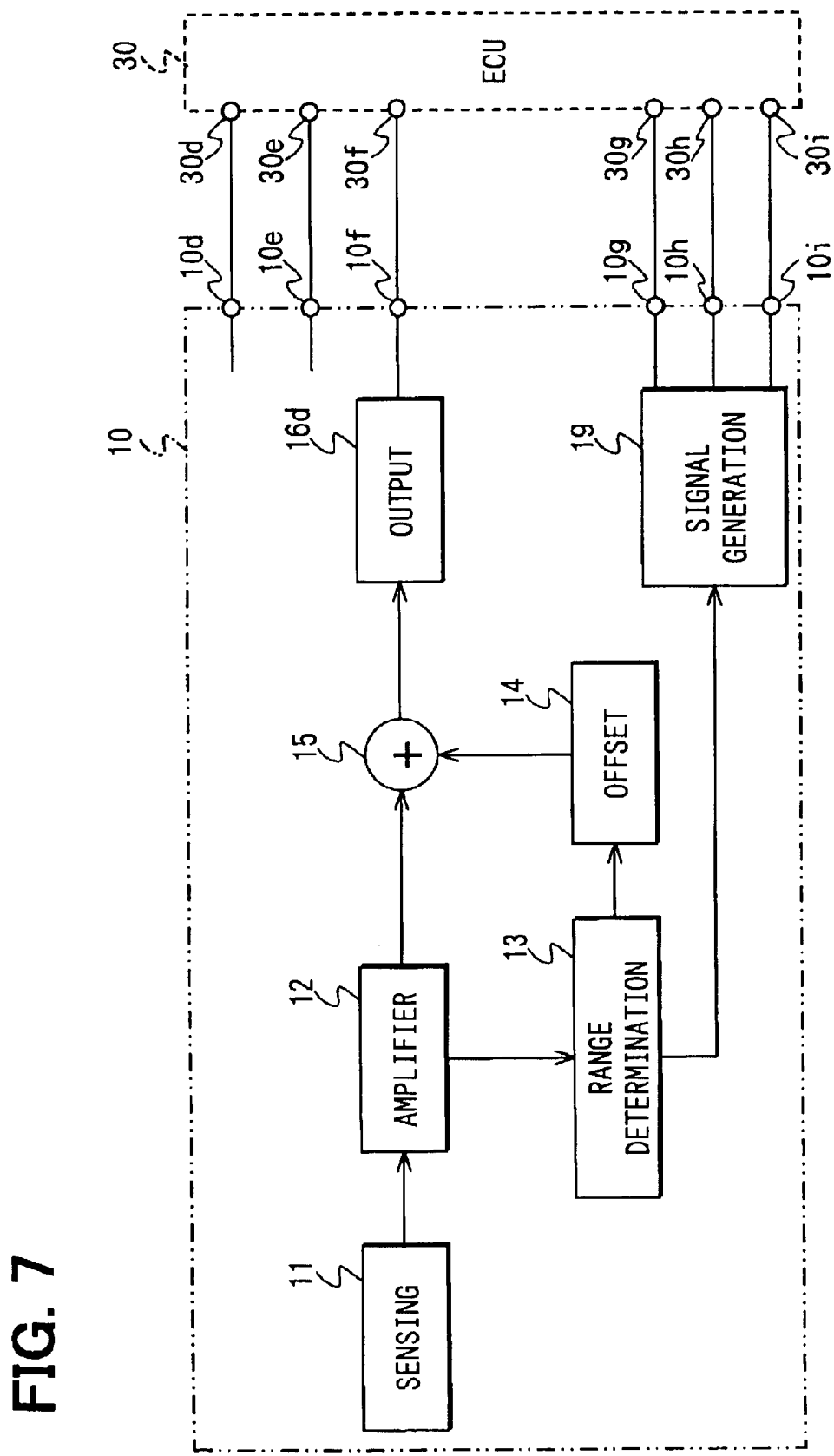
FIG. 7 is a schematic diagram showing pressure detection equipment according to the fourth embodiment of the present invention.
Figure 8:
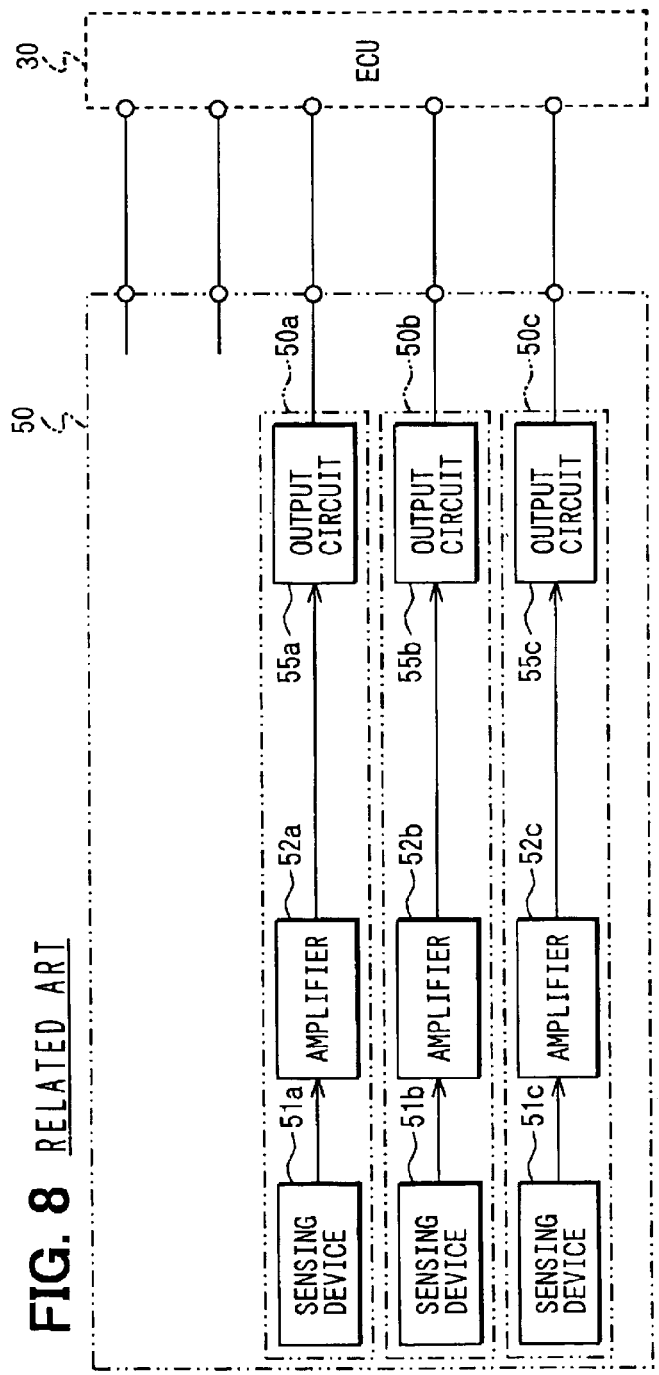
FIG. 8 is a schematic diagram showing a physical quantity sensor according to a related art.
Figure 9:
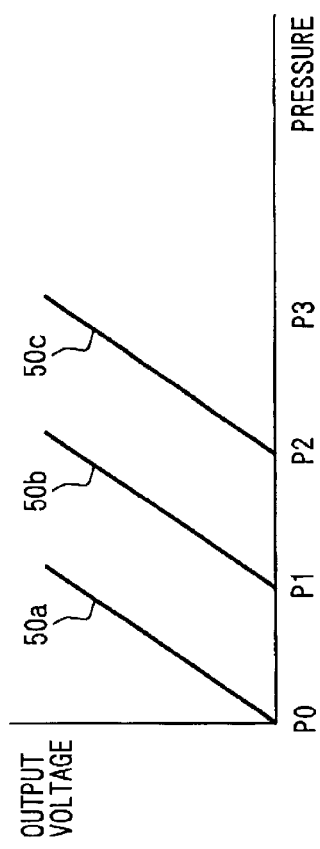
FIG. 9 is a graph showing a relationship between an output voltage of the sensor and detected pressure according to the related art.

The pressure detection equipment 10 according to the fourth embodiment includes the sensing device 11, the amplifier 12, the range-determination circuit 13, the offset circuit 14, the adder 15, an output circuit 16d, and a generation circuit 19, as shown in FIG. 7. The power supply terminal 10d, the ground terminal 10e, and the signal terminal 10f–10i in the pressure detection equipment 10 connect to the power supply terminal 10d, the ground terminal 10e, and the signal terminal 10f–10i in the ECU 30 through the wire harness, respectively.

The generation circuit 19 converts the range-determination signal so that the converted range-determination signal adjusts to a specification of system in the ECU 30. For example, when the range-determination signal is a 3-bit signal, the lowest output range of the ECU 30 is expressed as "111", and the range-determination signal is expressed as "000", the generation circuit 19 converts the range-determination signal to "111".

The output circuit 16d outputs the final output voltage to the ECU 30. The ECU 30 detects the final output voltage and the converted range-determination signal. Thus, the ECU 30 calculates the pressure by adding the offset adjustment voltage in accordance with the range-determination signal to the final output voltage.

In the fourth embodiment, the variable range of the output circuit 16d can be set large, so that the ECU 30 can detect the output voltage from the output circuit 16c accurately.

Further, the equipment 10 detects both a large and a fine change in pressure. Moreover, the ECU 30 can detect the range-determination signal without adding a new signal wire between the pressure detection equipment 10 and the ECU 30.

(Modification)

Although the range-determination circuit 13, the offset circuit 14, the adder 15, and the like are constructed by discrete circuits, they can be constructed by software.

Although the sensing device 11 provides a pressure sensor, other physical quantity sensors can be used as the sensing device 11. For example, the physical quantity sensor detects a physical quantity, such as temperature, acceleration, and humidity.

Such changes and modifications are to be understood as being within the scope of the present invention as defined by the appended claims.

What is claimed is:

1. Physical quantity detection equipment comprising:
    a detector for detecting physical quantity, and for outputting a first voltage corresponding to the detected physical quantity;
    an amplifier for amplifying the first voltage;
    an offset adjustment means for determining a measurement range of the amplified first voltage among a plurality of predetermined measurement ranges, and for outputting a second voltage corresponding to the determined measurement range;
    an addition means for subtracting the second voltage from the amplified first voltage, and for outputting the subtracted amplified first voltage, which is in the determined measurement range; and
    an output means for outputting the subtracted amplified first voltage to an outside circuit, and for informing the determined measurement range to the outside circuit,
    wherein the outside circuit calculates the physical quantity based on the subtracted amplified first voltage and the determined measurement range.

2. The equipment according to claim 1,
    wherein the output means controls consumption current, which is consumed in the output means and is supplied to the output means from the outside circuit, and
    wherein the consumption current corresponds to the determined measurement range so that the output means informs the determined measurement range to the outside circuit.

3. The equipment according to claim 1,
    wherein the output means supplies current to the outside circuit, and
    wherein the supplied current corresponds to the determined measurement range so that the output means informs the determined measurement range to the outside circuit.

4. The equipment according to claim 1,
    wherein the output means modulates the subtracted amplified first voltage with a predetermined frequency corresponding to the determined measurement range, and outputs the modulated subtracted amplified first voltage to the outside circuit so that the output means informs both the subtracted amplified first voltage and the determined measurement range to the outside circuit.

5. The equipment according to claim 1,
    wherein the output means includes a first circuit for outputting the subtracted amplified output voltage to the outside circuit and a second circuit for outputting a range signal corresponding to the determined measurement range to the outside circuit so that the output means informs the determined measurement range to the outside circuit.

6. A method for detecting physical quantity comprising the steps of:

detecting physical quantity, so that a first voltage corresponding to the detected physical quantity is outputted;

determining a measurement range of the first voltage among a plurality of predetermined measurement ranges, so that a second voltage corresponding to the determined measurement range is outputted;

subtracting the second voltage from the first voltage; and outputting the subtracted first voltage and an information about the determined measurement range.

7. The method according to claim 6, wherein the subtracted first voltage and the information about the determined measurement range are detected by an outside circuit so that the outside circuit calculates the physical quantity based on the subtracted first voltage and the information about the determined measurement range.

8. The method according to claim 6, wherein the outputting step further includes the step of:

controlling consumption current, which is consumed in a circuit that provides the outputting step and is supplied from an outside circuit, wherein the consumption current corresponds to the determined measurement range so that the outside circuit calculates the physical quantity based on the subtracted first voltage and the determined measurement range.

9. The method according to claim 6, wherein the outputting step further includes the step of:

supplying current to an outside circuit, wherein the current corresponds to the determined measurement range so that the outside circuit calculates the physical quantity based on the subtracted first voltage and the determined measurement range.

10. The method according to claim 6, wherein the outputting step further includes the steps of:

modulating the subtracted first voltage with a predetermined frequency corresponding to the determined measurement range; and outputting the modulated subtracted first voltage to an outside circuit so that the outside circuit calculates the physical quantity based on the modulated subtracted first voltage.

11. The method according to claim 6, wherein the physical quantity is pressure, temperature, position, velocity, acceleration, angle, angular speed, or angular acceleration.

12. The method according to claim 6, wherein the determining step and the subtracting step are performed by hard ware or soft ware.

* * * * *